United States Patent [19]

Komiya et al.

[11] Patent Number: 4,554,462

[45] Date of Patent: Nov. 19, 1985

[54] NON-POLARIZED CONTACTLESS RELAY

[75] Inventors: Hidetsugu Komiya; Michiya Inoue; Yoshiyuki Saitoh, all of Hino, Japan

[73] Assignee: Fanuc Limited, Minamitsuru, Japan

[21] Appl. No.: 474,337

[22] Filed: Mar. 11, 1983

[30] Foreign Application Priority Data

Mar. 16, 1982 [JP] Japan .............................. 57-36403[U]
Mar. 16, 1982 [JP] Japan .............................. 57-36404[U]

[51] Int. Cl.⁴ .......................................... H03K 17/56
[52] U.S. Cl. .................................. 307/140; 307/240; 307/244; 307/575; 307/583
[58] Field of Search .................... 307/132 E, 140, 239, 307/240, 244, 571, 575, 577, 583, 584; 363/18-21, 131-134

[56] References Cited

U.S. PATENT DOCUMENTS

| | | | |
|---|---|---|---|
| 3,378,700 | 4/1968 | Stewart | 363/40 |
| 3,418,495 | 12/1968 | Bose | 307/239 |
| 3,602,738 | 8/1971 | Bohm | 307/244 |
| 3,651,324 | 3/1972 | Dingwall | 307/304 X |
| 3,673,435 | 6/1972 | Stanley | 307/257 |
| 3,767,942 | 10/1973 | Schwartz | 307/257 |
| 3,898,549 | 8/1975 | Mitchell | 307/240 X |
| 4,052,623 | 10/1977 | Loberg | 307/571 |
| 4,095,128 | 6/1978 | Tanigaki | 363/134 X |
| 4,150,424 | 4/1979 | Nuechterlein | 363/26 |
| 4,213,065 | 7/1980 | Morcom | 307/583 |
| 4,351,020 | 9/1982 | Leti et al. | 363/134 X |
| 4,417,153 | 11/1983 | Onodera et al. | 307/140 |

FOREIGN PATENT DOCUMENTS

| | | |
|---|---|---|
| 2132572 | 1/1972 | Fed. Rep. of Germany . |
| 2533107 | 10/1977 | Fed. Rep. of Germany . |
| 2850841 | 8/1979 | Fed. Rep. of Germany . |
| 2821812 | 11/1979 | Fed. Rep. of Germany . |
| 3028986 | 3/1982 | Fed. Rep. of Germany . |

OTHER PUBLICATIONS

Electronics, vol. 51, No. 13, Jun. 22, 1978, A. D. Evans et al., pp. 105-112, "Higher Power Ratings Extend V-MOS FETs' Dominion".

European Search Report, completed May 27, 1983, by Examiner Arendt in Berlin.

Primary Examiner—J. R. Scott
Assistant Examiner—Derek S. Jennings
Attorney, Agent, or Firm—Staas & Halsey

[57] ABSTRACT

Disclosed is a non-polarized, contactless relay constructed of electronic circuitry devoid of mechanical contacts but capable of performing the same function as a relay with such contacts. The relay includes a transformer, a control circuit for applying an oscillatory signal to the primary windings of the transformer in accordance with a command input, a rectifying circuit for rectifying A.C. power obtained from the secondary windings of the transformer in response to the oscillatory signal applied to the primary windings, a smoothing circuit which smooths the rectified output produced by the rectifying circuit for delivering D.C. power, and switching means composed of a pair of MOS-type field-effect transistors driven by the D.C. output of the smoothing circuit. The command input, namely "1" or "0" logic, applied to the control circuit results in the supply of the D.C. signal to the MOSFETs when logical "1" holds, driving the MOSFETs into conduction to form a closed path between the output terminals of the switching means and, hence, close the relay.

2 Claims, 3 Drawing Figures

NON-POLARIZED CONTACTLESS RELAY

CROSS REFERENCE TO RELATED APPLICATION

This application is related to copending application U.S. Ser. No. 489,089.

This invention relates to a non-polarized relay which does not have mechanical contacts. More particularly, the invention relates to a non-polarized, contactless relay which relies upon electronic circuitry to perform the same function as a relay with contacts.

In general, a relay is used to transmit signals between two isolated points. For this purpose, a relay having mechanical contacts is employed widely in the art. A relay of this type, such as a reed relay, finds use in transmitting signals between two systems having different signal levels, as when interfacing a numerical control device and machine tool. The relay with contacts applied in this fashion is ideal in that it is non-polarized, capable of input/output isolation and small in size. Nevertheless, relays with contacts of a mechanical nature are disadvantageous in that their lifetime is severely limited by their reliance upon such contacts. In response to the need for development of a relay without contacts, or a so-called "contactless" relay, various relays incorporating different kinds of electronic circuitry have been proposed, but none have the aforementioned excellent properties possessed by relays provided with contacts.

SUMMARY OF THE INVENTION

Accordingly, an object of the present invention is to provide a non-polarized relay free of mechanical contacts.

Another object of the present invention is to provide a non-polarized, contactless relay capable of performing the same function as a relay with mechanical contacts.

Still another object of the present invention is to provide a non-polarized, contactless relay capable of input/output isolation.

A further object of the present invention is to provide a non-polarized, contactless relay of long life or "semi-permanent" nature.

Yet another object of the present invention is to provide a non-polarized, contactless relay capable of being manufactured in small size.

Another object of the present invention is to provide a non-polarized, contactless relay which functions through use of electronic circuitry.

Another object of the present invention is to provide a non-polarized, contactless relay having a memory or self-holding function.

According to the present invention, these and other objects are attained by providing a non-polarized, contactless relay which includes a transformer, a control circuit for applying an oscillatory signal to the primary windings of the transformer in accordance with a command input, a rectifying circuit for rectifying A.C. power obtained from the secondary windings of the transformer in response to the oscillatory signal applied to the primary windings, a smoothing circuit which smooths the rectified output produced by the rectifying circuit for delivering D.C. power, and switching means composed of a pair of MOS-type field-effect transistors driven by the D.C. output of the smoothing circuit. The command input, namely "1" or "0" logic, results in the supply of the D.C. signal to the MOSFETs when logical "1" holds, driving the MOSFETs into conduction to form a closed path between the output terminals of the switching means and, hence, close the relay.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Figure 1:
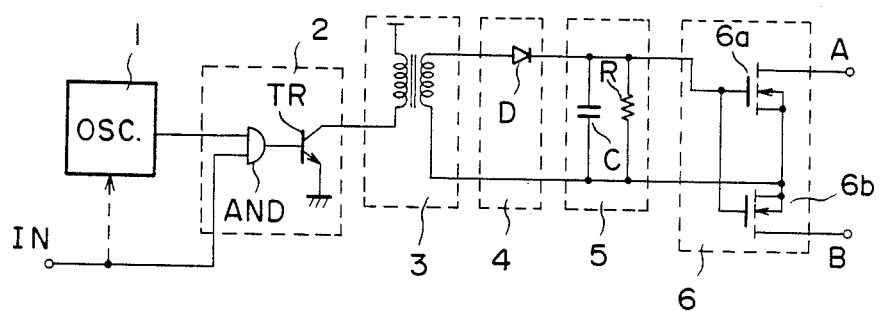
FIG. 1 is a circuit diagram illustrating an embodiment of a non-polarized, contactless relay according to the present invention.

Reference will now be had to FIG. 1 to describe a first embodiment of a non-polarized, contactless relay in accordance with the present invention. The relay comprises a control circuit which includes an oscillator circuit 1, specifically a pulse oscillator circuit such as an astable multivibrator, and a transformer drive circuit 2 having an AND gate AND and a transistor TR. The AND gate AND, which receives the output of the oscillator circuit 1 at one input terminal thereof, is gated open when a command input terminal IN connected to the other input terminal thereof goes high (logical "1"), whereby the AND gate delivers the oscillator circuit output to the base of the transistor TR. The relay further comprises a transformer 3 having its primary winding connected to the collector of the transistor TR in the transformer drive circuit 2. Thus the transformer 3 is driven by the transistor TR turned on and off by the output of the oscillator circuit 1. The secondary winding of the transformer T is connected to a rectifying circuit 4 having a diode D for rectifying the A.C. power developed by the secondary winding of the transformer. A smoothing circuit 5, comprising a capacitor C and a resistor R connected in parallel, is operable to smooth the output of the rectifying circuit 4 to provide a D.C. signal. The relay also includes a switching element 6 comprising a pair of parallel-connected MOS-type field-effect transistors 6a, 6b, referred to as MOSFETs hereinafter. The gates of the MOSFETs 6a, 6b are tied together and connected to one output terminal of the smoothing circuit 5, and the source electrodes thereof are similarly tied together and connected to the other output terminal of the smoothing circuit 5. The drain electrodes of the respective MOSFETs constitute output terminals A, B for connection to a load.

In the operation of the relay shown in FIG. 1, a high-level signal is applied to the command input terminal IN from externally located control means (not shown) to turn on, i.e., close, the relay. The high-level signal opens the AND gate AND of the drive circuit 2, applying the oscillatory output of the oscillator circuit 1 to the base of transistor TR. The later is switched on and off by the oscillatory signal at its base and drives the primary winding of the transformer 3 connected to its collector, whereby a voltage is induced in the secondary winding of the transformer. A.C. power thus is obtained from the secondary winding and is subsequently rectified by the rectifying circuit 4 and smoothed by the smoothing circuit 5, providing a direct current. The D.C. output of the smoothing circuit 5 is applied to the gates of the MOSFETs 6a, 6b, thereby driving the MOSFETs into conduction to form a current path between the output terminals A and B. The current path formed between these terminals will prevail for as long as the command input terminal IN "1" is high. The terminals A, B will be isolated from each other when the command input terminal IN is at a low potential, namely logical "0". Thus the arrangement acts as a relay, opening and closing in response to the potential at the input terminal IN.

In the preferred embodiment illustrated in FIG. 1, the circuitry utilizes a fly-back type D.C.—D.C. converter, in which use is made of the voltage induced in the secondary winding when the primary winding current is cut off, whereby a gate voltage of approximately 10 to 15V necessary for turning on the MOSFETs is obtained from a power supply of 5V. It should be obvious that the secondary winding connections can be reversed in polarity, and that a higher voltage step-up can be gained by changing the turn ratio of the transformer. Thus the MOSFETs 6a, 6b may be turned on and held on continuously during the time that input terminal IN is high, whereby the arrangement will act as a so-called normally-open relay, the MOSFETs employed being of the enhancement-type. Conversely, to obtain a normally-closed relay, use of depletion-type MOSFETs will suffice. In any case, MOSFETs are adopted because of their pure resistance characteristics during conduction and because terminal output voltage is much lower than seen in an ordinary transistor when the load current is small. A relay relying upon such MOSFETs thus has characteristics during conduction that are very near those of a relay having mechanical contacts. Further, since a MOSFET exhibits a diode characteristic, a single MOSFET would conduct in only one direction. In the present invention, therefore, two of these elements are employed in parallel to avoid this phenomenon.

Note that the oscillator circuit 1 in the arrangement of FIG. 1 can be adapted to oscillate only when the command input terminal IN is high, thereby eliminating the need for the AND gate AND.

Figure 2:
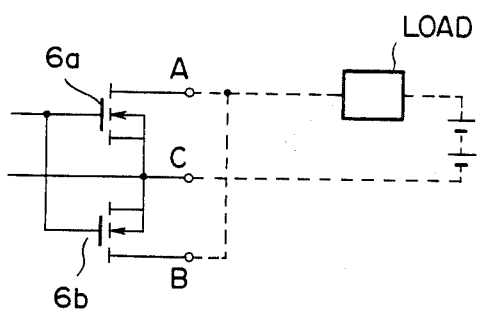
FIG. 2 is a circuit diagram illustrating a principal portion of a non-polarized, contactless relay according to another embodiment of the present invention.

In another embodiment of the present invention, the switching element 6 is provided with an output terminal C in addition to the output terminals A, B formed by the drain electrodes of the MOSFETs 6a, 6b. As shown in FIG. 2, the additional output terminal C is provided by extending the interconnected source electrodes into an output terminal. With such an arrangement, in the case of a D.C. load, the drain electrodes may be tied together and the load connected between the source electrode and the interconnected drain electrodes, as depicted in FIG. 2, making it possible to pass twice as much electric current as in the arrangement of FIG. 1. The load is indicated at L.

Thus, according to the embodiments of FIGS. 1 and 2, a D.C. command input is converted into an alternating current by the oscillatory output of the oscillator circuit, the alternating current, upon passage through the transformer, is converted into a direct current by the rectifying and smoothing circuits and is then employed to actuate the MOSFETs which constitute the switching element. This provides a contactless relay which affords input/output isolation and which has the same advantages as a relay with contacts, namely small size and non-polarized operation. In addition, since the terminal output voltage is extremely low, an ideal contact characteristic equivalent to that of an ordinary relay with contacts can be obtained in the region of small load currents. Although a voltage is needed to operate the MOSFETs, almost no current is required for relay operation so that the transformer and peripheral circuitry can be reduced in size. By virtue of the contactless operation, moreover, the relay of the present invention provides semi-permanent operation, extends the life of the apparatus in which it is employed and facilitates maintenance.

Figure 3:
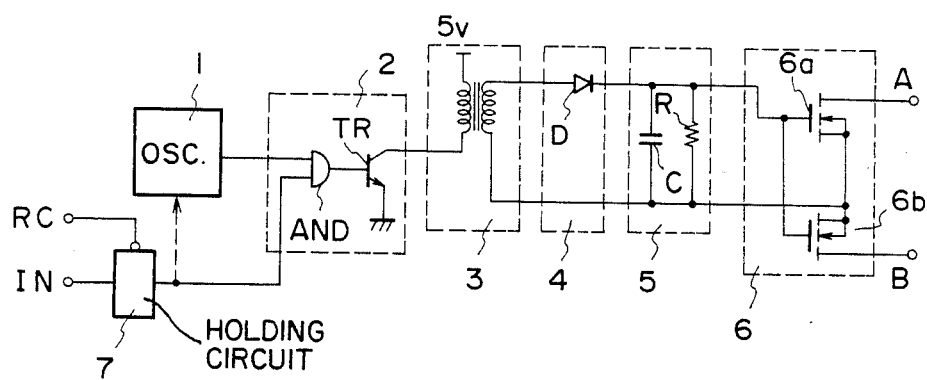
FIG. 3 is a circuit diagram illustrating a third embodiment of a non-polarized, contactless relay according to the present invention.

Reference will how be had to FIG. 3 to describe a third embodiment of the invention, in which a holding circuit 7 is provided between the input terminal IN and the AND gate AND of the drive circuit 2. The latter may comprise a latch circuit for holding the level (either "1" or "0") of the signal at the command input terminal IN when a latch control signal RC is generated and applied to the holding circuit.

In operation, to turn on, or close, the relay, a high-level signal is applied to the command input terminal IN. Then, when the latch control signal RC, applied in the form of a clock, enters the holding circuit 7, the latter holds the input terminal IN at the high level, i.e., logical "1". The relay will therefore be held in the closed state. To release the circuit 7 from the high-level holding state, logical "0" is applied to the command input terminal IN, after which the arrival of the next latch control signal RC will release the holding circuit 7. According to this arrangement, therefore, the externally located control means which supplies the command input for operating the relay applies logical "1" to the input terminal IN only for the initial closure of the relay. The arrival of the next latch control signal RC will hold the relay in the closed, i.e., on state. The relay is placed in the off state when the latch control signal RC arrives with logical "0" at input terminal IN. Thus, since the holding circuit 7 delivers a "1" output during actuation of the relay, it is unnecessary for the high level to be applied continuously to the input terminal IN. When the output of the holding circuit 7 goes to logical "1", the AND gate AND of the drive circuit 2 opens to apply the oscillatory output of the oscillator circuit 2 to the base of the transistor TR. The later is switched on and off by the oscillatory signal at its base and drives the primary winding of the transformer 3 connected to its collector, whereby a voltage is induced in the secondary winding of the transformer. A.C. power thus is obtained from the secondary winding and is subsequently rectified by the rectifying circuit 4 and smoothed by the smoothing circuit 5, providing a direct current. The D.C. output of the smoothing circuit 5 is applied to the gates of the MOSFETs 6a, 6b, thereby driving the MOSFETs into conduction to form a current path between the output terminals A and B.

It should be noted that the oscillator circuit 1 in the arrangement of FIG. 3 can be adapted to oscillate when the output of the holding circuit 1 is high, thereby eliminating the need for the AND gate AND. Flip-flops rather than a latch circuit may be used to construct the holding circuit 7.

The modification shown in FIG. 2 can also be applied to the arrangement of FIG. 3. In other words, the source electrodes of the MOSFETs 6a, 6b can be commonly connected and employed as an output terminal in addition to the drain electrodes. For a D.C. load, the drain electrodes can be interconnected and the load connected between the source electrode and the drain electrodes, whereby twice as much current can flow in comparison with the arrangement of FIG. 3.

Thus, in the embodiment depicted in FIG. 3, the arrangement of FIG. 1 is provided with the holding circuit 7 so that the external control means need not apply the relay operation command to the input terminal IN continuously when it is desired to keep the relay in operation. Thus a relay with a memory function (or so-called "self-holding" relay), capable of lightening the burden upon the external control means, can be realized without relying upon mechanical contacts. As many apparently widely different embodiments of the present invention can be made without departing from the spirit and scope thereof, it is to be understood that the invention is not limited to the specific embodiments thereof except as defined in the appended claims.

We claim:

1. A non-polarized, contactless relay comprising:
    a transformer having primary and secondary windings;
    oscillator means for providing an oscillating signal;
    an AND gate having a first input operatively connected to receive said oscillating signal, a second input and an output;
    a transistor having a collector operatively connected a primary winding of said transformer, an emitter operatively connected to ground and a base operatively connected said output of said AND gate;
    a diode having a anode operatively connected to a first end of said secondary transformer and a cathode, for rectifying A.C. power obtained from the secondary windings of said transformer in response to the oscillating signal applied to the primary windings thereof, said diode producing a rectified output;
    a parallel connected resistor and capacitor, having a first end operatively connected to said cathode and a second end operatively connected to a second end of said secondary winding of said transformer, for smoothing the rectified output produced by said diode for delivering D.C. power; and
    a pair of MOS-type field-effect transistors having interconnected gate electrodes operatively connected to said cathode, interconnected source electrodes operatively connected to said second end of said secondary winding and respective drain electrodes, said gate electrodes being driven by the D.C. power from said parallel connected resistor and capacitor; and
    latch means having an input operatively connected to receive a command input and having an output operatively connected to said second input of said AND gate, for storing said command input and providing said command input as the output of said latch means.

2. The relay according to claim 1, wherein said drain electrodes are interconnected.

* * * * *

UNITED STATES PATENT AND TRADEMARK OFFICE
CERTIFICATE OF CORRECTION

PATENT NO. : 4,554,462
DATED : November 19, 1985
INVENTOR(S) : Komiya et al.

It is certified that error appears in the above-identified patent and that said Letters Patent is hereby corrected as shown below:

Between lines 8 & 9, insert --BACKGROUND OF THE INVENTION--.

Signed and Sealed this

Fourth Day of February 1986

[SEAL]

Attest:

Attesting Officer

DONALD J. QUIGG

Commissioner of Patents and Trademarks